(12) United States Patent
Umetsu et al.

(10) Patent No.: US 12,178,138 B2
(45) Date of Patent: Dec. 24, 2024

(54) MAGNETIC MEMORY

(71) Applicant: Kioxia Corporation, Tokyo (JP)

(72) Inventors: Nobuyuki Umetsu, Kawasaki Kanagawa (JP); Yasuaki Ootera, Yokohama Kanagawa (JP); Masaki Kado, Kamakura Kanagawa (JP); Michael Arnaud Quinsat, Yokohama Kanagawa (JP); Naoharu Shimomura, Tokyo (JP); Tsutomu Nakanishi, Yokohama Kanagawa (JP); Shiho Nakamura, Kawasaki Kanagawa (JP); Susumu Hashimoto, Tokyo (JP); Tsuyoshi Kondo, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 600 days.

(21) Appl. No.: 17/447,360

(22) Filed: Sep. 10, 2021

(65) Prior Publication Data

US 2022/0302370 A1    Sep. 22, 2022

(30) Foreign Application Priority Data

Mar. 18, 2021  (JP) .................. 2021-044906

(51) Int. Cl.
*G11C 16/04*    (2006.01)
*G11C 11/16*    (2006.01)
(Continued)

(52) U.S. Cl.
CPC .......... *H10N 50/80* (2023.02); *G11C 11/161* (2013.01); *G11C 11/165* (2013.01); *H10B 61/20* (2023.02); *H10N 50/01* (2023.02)

(58) Field of Classification Search
CPC ............................ G11C 11/161; G11C 11/165
See application file for complete search history.

(56) References Cited

U.S. PATENT DOCUMENTS

| 9,153,340 B2 | 10/2015 | Morise et al. |
| 9,184,212 B2 | 11/2015 | Morise et al. |

(Continued)

FOREIGN PATENT DOCUMENTS

| JP | 4962889 B2 | 6/2012 |
| JP | 5071908 B2 | 11/2012 |

(Continued)

*Primary Examiner* — Pho M Luu
(74) *Attorney, Agent, or Firm* — Finnegan, Henderson, Farabow, Garrett & Dunner, LLP (57) ABSTRACT

A magnetic memory includes: a first and second wirings; an insulator portion; a magnetic member including: a first portion electrically connected to the first wiring; a second portion electrically connected to the second wiring; and a third portion disposed between the first and second portions, the magnetic member extending in a first direction from the first portion toward the second portion and surrounding the insulator portion, and in a cross-section parallel to the first direction and including part of the magnetic member and part of the insulator portion, a curvature of the first portion being smaller than a curvature of the third portion, a length of the first portion in the first direction being greater than half a length of the third portion in the first direction; and a control circuit electrically connected to the first and second wirings.

17 Claims, 9 Drawing Sheets

(51) Int. Cl.
*H10B 61/00* (2023.01)
*H10N 50/80* (2023.01)
*H10N 50/01* (2023.01)

(56) References Cited

U.S. PATENT DOCUMENTS

| | | |
|---|---|---|
| 10,062,449 B2 | 8/2018 | Choe |
| 10,453,545 B2 | 10/2019 | Ootera et al. |
| 10,482,941 B2 | 11/2019 | Shimada et al. |
| 11,120,858 B2 * | 9/2021 | Ueda .................... G11C 11/165 |
| 11,610,617 B2 * | 3/2023 | Shimomura ........ G11C 11/1675 |
| 2016/0056368 A1 | 2/2016 | Parkin et al. |
| 2020/0303624 A1 | 9/2020 | Umetsu et al. |
| 2022/0108737 A1 * | 4/2022 | Sonobe .................. H10N 50/80 |

FOREIGN PATENT DOCUMENTS

| | | |
|---|---|---|
| JP | 6172850 B2 | 8/2017 |
| JP | 6184680 B2 | 8/2017 |
| JP | 2019-3989 A | 1/2019 |
| JP | 2019-160372 A | 9/2019 |
| JP | 2020-155558 A | 9/2020 |

\* cited by examiner

MAGNETIC MEMORY

CROSS REFERENCE TO RELATED APPLICATIONS

This application is based upon and claims the benefit of priority from the prior Japanese Patent Application No. 2021-044906, filed on Mar. 18, 2021, the entire contents of which are incorporated herein by reference.

FIELD

Embodiments of the present invention relate to magnetic memories.

BACKGROUND

There are known magnetic memories that move (shift) each domain wall of a magnetic member by applying a current to the magnetic member. In such a magnetic memory, narrowed portions are formed in a tubular magnetic member for controlling the domain wall positions. This magnetic memory is expected to accurately control the stop position of each domain wall.

DETAILED DESCRIPTION

The following is a description of embodiments of the present invention, with reference to the accompanying drawings. The drawings are schematic or conceptual, and the relationships between the thicknesses and the widths of the respective components, the proportions of the sizes of the components, and the like are not necessarily the same as the actual ones. Even in a case where the same components are shown, the dimensions and the proportions may be indicated differently from each other between the drawings.

In this specification and the respective drawings, the same components as those already described with reference to the previously described drawings are denoted by the same reference numerals as those used in the previously described drawings, and detailed explanation thereof will not be unnecessarily repeated.

First Embodiment

Figure 1:
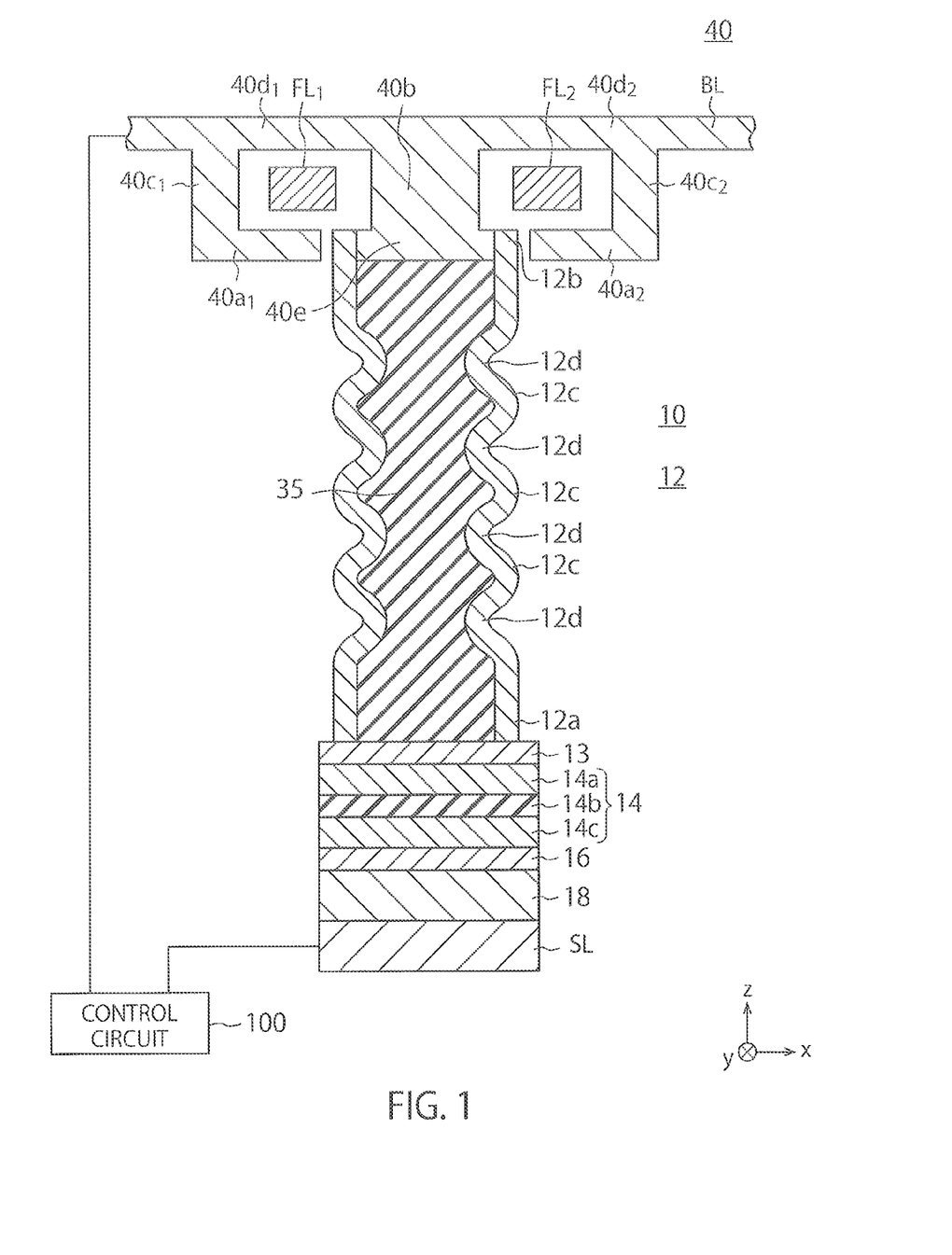
FIG. 1 is a cross-sectional diagram showing the configuration of a magnetic memory according to a first embodiment.

FIG. 1 shows a magnetic memory according to a first embodiment. The magnetic memory of the first embodiment includes a memory cell 10. The memory cell 10 includes a magnetic member (a magnetic memory line) 12, an insulator portion 35, a nonmagnetic conductive layer 13, a magnetoresistive element 14, a nonmagnetic conductive layer 16, a switching portion 18, a yoke 40, a bit line BL, a source line SL, field lines $FL_1$ and $FL_2$, and a control circuit 100.

The magnetic member 12 is formed with a perpendicular magnetic member that includes a first end portion 12a and a second end portion 12b, and extends in a first direction (z direction) from the first end portion 12a to the second end portion 12b. The magnetic member 12 has a tubular shape. For example, the magnetic member 12 can have an outer shape that is a circular shape, an elliptical shape, or a polygonal shape in a cross-section taken along a plane perpendicular to the z direction. Since the magnetic member 12 is formed with a perpendicular magnetic member, the axis of easy magnetization is a direction perpendicular to the z direction. Accordingly, the magnetization direction of the magnetic member 12 is a radial direction, and the magnetic member 12 has an outward magnetization direction or an inward magnetization direction. The insulator portion 35 is disposed in the magnetic member 12. That is, the magnetic member 12 is disposed so as to surround the outer periphery of the insulator portion 35.

The magnetic member 12 also includes a plurality of regions 12c aligned in the z direction. Narrowed portions 12d formed on the outer surface of the magnetic member 12 are located between these regions 12c. Further, these regions 12c each have at least one magnetic domain. In the magnetic member 12, when a drive current (a shift current) is supplied between the first end portion 12a and the second end portion 12b, a domain wall in the magnetic member 12 moves in the z direction. In the magnetic member 12, the first end portion 12a is electrically connected to the magnetoresistive element 14, and the second end portion 12b is electrically connected to the bit line BL. Here, in this specification, "A is electrically connected to B" means that A and B may be directly connected, or may be indirectly connected via a conductor, a variable resistance portion (including a magnetoresistive element or the like), a switching portion (such as a selector, a transistor, for example), or the like. Note that, in FIG. 1, the nonmagnetic conductive layer 13 is disposed between the first end portion 12a and the magnetoresistive element 14.

Figure 2:
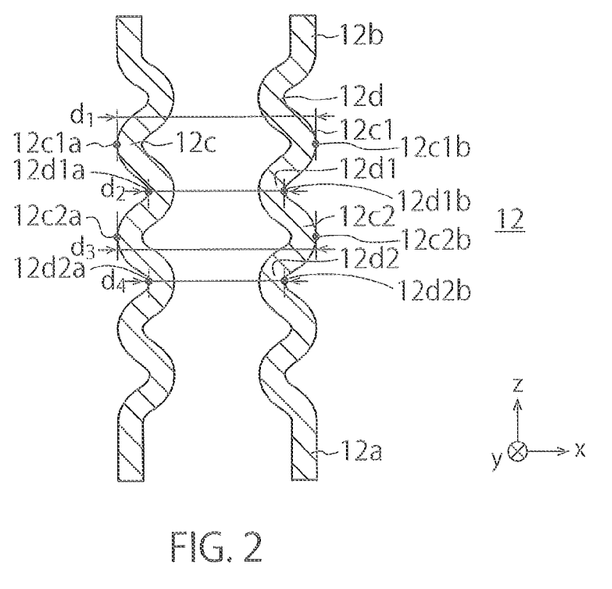
FIG. 2 is a cross-sectional diagram for explaining a shape of a magnetic member in the first embodiment.

Next, the maximum length and the minimum length of the magnetic member are described. In a predetermined cross-section of the magnetic member perpendicular to the z direction, the distance between two positions in the outer peripheral portion of the magnetic member is now described. In a case where the cross-sectional shape of the magnetic member is a circular shape, for example, this distance corresponds to the diameter of the circle. In a case where the cross-sectional shape of the magnetic member is an elliptical shape, this distance corresponds to the major axis of the ellipse. In a case where the cross-sectional shape of the magnetic member is a polygonal shape, this distance corresponds to the length of one diagonal line of the polygon. The maximum length and the minimum length of the magnetic member in a direction orthogonal to the z direction are determined on the basis of a cross-section that is parallel to the z direction and includes the above-mentioned two positions between which the distance becomes longest. FIG. 2 shows the cross-section of the magnetic member 12, which is determined as above and is parallel to the z direction. In this cross-section, a region 12c1, a narrowed portion 12d1, a region 12c2, and a narrowed portion 12d2 are arranged in the z direction. The distance between an end portion 12c1a and an end portion 12c1b of the region 12c1 in the x direction in a cross-section parallel to the z direction of the region 12c1 is the maximum length d1 in the region 12c1, the distance between an end portion 12d1a and an end portion 12d1b of the narrowed portion 12d1 in the x direction in a cross-section parallel to the z direction of the narrowed portion 12d1 is the minimum length d2 of the region 12c1 or the region 12c2, the distance between an end portion 12c2a and an end portion 12c2b of the region 12c2 in the x direction in a cross-section parallel to the z direction of the region 12c2 is the maximum length d3 of the region 12c1, the distance between an end portion 12d2a and an end portion 12d2b of the narrowed portion 12d2 in the x direction in a cross-section parallel to the z direction of the narrowed portion 12d2 is the minimum length d4 of the region 12c2, and the conditions shown below are satisfied:

$d1 > d2, d4$ $d3 > d2, d4$

According to the findings made by the inventors of the present invention, the threshold of the drive current for moving a domain wall in the magnetic member 12 becomes higher due to degradation of the magnetic characteristics or the like at the first end portion 12a and the second end portion 12b. Further, in a case where the length of the first end portion 12a in the z direction is small, a sufficient magnetic domain region cannot be secured, and reading efficiency drops.

Figure 3:
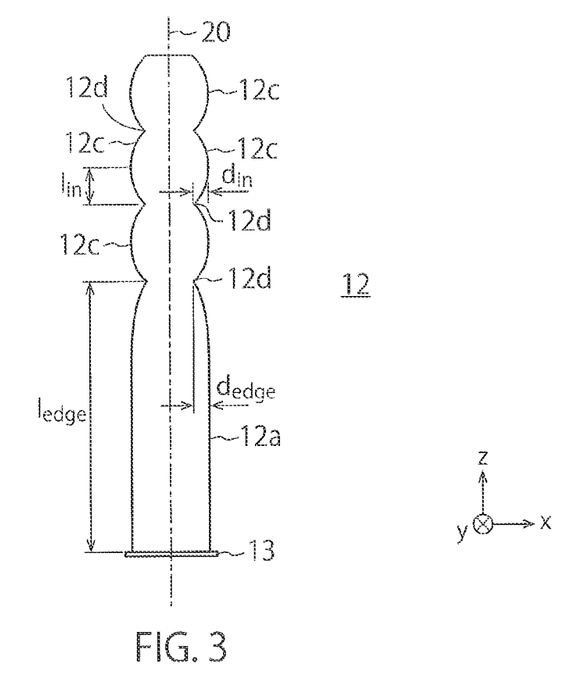
FIG. 3 is a cross-sectional diagram for explaining a shape of a magnetic member in the first embodiment.

FIG. 3 is a cross-sectional view of the magnetic member 12, taken along a plane that is parallel to the z direction and includes the central axis 20 of the magnetic member 12. This cross-section corresponds to the cross-section that is parallel to the z direction and is determined as described above. In this embodiment, the curvature of the first end portion 12a of the magnetic member 12 is made smaller than the curvature of the regions 12c, and the length of the first end portion 12a in the z direction is made greater. Accordingly, where the length of the first end portion 12a in the z direction, which is the length from the narrowed portion 12d closest to the first end portion 12a to the nonmagnetic conductive layer 13, is represented by $l_{edge}$, a half of the value obtained by subtracting the diameter of the narrowed portion 12d closest to the first end portion 12a from the size of the bulge of the first end portion 12a, which is the diameter of the first end portion 12a, is represented by $d_{edge}$, a half of the length of a region 12c in the z direction is represented by $l_{in}$, and a half of the value obtained by subtracting the diameter of the narrowed portion 12d closest to the region 12c from the size of the bulge of the region 12c, which is the diameter of the region 12c, is represented by $d_{in}$, the conditions shown below are satisfied:

$l_{edge} > l_{in}$ $d_{edge}/l_{edge} < d_{in}/l_{in}$

When the external shape of the first end portion 12a is like an arc, for example, $d_{edge}$ corresponds to the length to the arc of a chord, and $l_{edge}$ corresponds to the length of the chord. Accordingly, the ratio $d_{edge}/l_{edge}$ corresponds to the curvature of the first end portion 12a. The first inequality indicates that the length of the first end portion 12a is greater than half the length of the region 12c. The second inequality indicates that the curvature of the first end portion 12a in the cross-section of the first end portion 12a is smaller than the curvature of the regions 12c in the cross-section of the regions 12c. Further, $d_{edge}$ means a value that is half the difference between the maximum diameter and the minimum diameter of the first end portion 12a, and $d_{in}$ means a value that is half the difference between the maximum diameter and the minimum diameter of the regions 12c. Here, the maximum diameter and the minimum diameter of the first end portion 12a correspond to the maximum length and the minimum length of the first end portion 12a in the direction orthogonal to the z direction, respectively, and the maximum diameter and the minimum diameter of the regions 12c correspond to the maximum length and the minimum length of the regions 12c in the direction orthogonal to the z direction, respectively. Note that the central axis of the magnetic member 12 extends in the z direction and penetrates the insulator portion 35 disposed in the tube of the magnetic member 12 as shown in FIG. 1.

The material of the magnetic member 12 can be not only cobalt or nickel, but also an alloy containing an element selected from among iron, cobalt, platinum, palladium, magnesium, and a rare earth element.

The magnetoresistive element 14 reads information written in the magnetic member 12, and may be a magnetic tunnel junction (MTJ) element, for example. Hereinafter, the magnetoresistive element 14 will be described as an MTJ element. The MTJ element 14 includes a free layer (a magnetization free layer) 14a having a variable magnetization direction, a fixed layer (a magnetization fixed layer) 14c having a fixed magnetization direction, and a nonmagnetic insulating layer (a tunnel barrier layer) 14b disposed between the free layer 14a and the fixed layer 14c. In the MTJ element 14, the free layer 14a is electrically connected to the first end portion 12a of the magnetic member 12 via the nonmagnetic conductive layer 13, and the fixed layer 14c is electrically connected to the source line SL. The source line SL may be a bit line. Here, "a magnetization direction being variable" means that the magnetization direction can vary with a stray magnetic field from the magnetic member 12 in a read operation described later, and "a magnetization direction being fixed" means that the magnetization direction does not vary with a stray magnetic field from the magnetic member 12.

The switching portion 18 is disposed between the non-magnetic conductive layer 16 and the source line SL, and is electrically connected to the source line SL. In FIG. 1, the source line SL extends in a direction intersecting the paper surface. The source line SL is connected to the control circuit 100, and is controlled.

The switching portion 18 may be a two-terminal switch element, for example. In a case where the voltage to be applied between the two terminals is equal to or lower than a threshold, the switching portion 18 is in a "high-resistance" state, and is electrically non-conductive, for example. In a case where the voltage to be applied between the two terminals is higher than the threshold, the switching portion 18 switches to a "low-resistance" state, which is an electrically conductive state, for example. In a case where a current that is equal to or greater than the holding current value continues to flow in an on-state, the switching portion 18 maintains the on-state. The switch element may have this function, regardless of the polarity of the voltage. The switching portion contains at least one or more chalcogen elements selected from the group consisting of Te, Se, and S, for example. Alternatively, a chalcogenide that is a compound containing the chalcogen element(s) may be contained. The switch element may further contain at least one or more elements selected from the group consisting of B, Al, Ga, In, C, Si, Ge, Sn, As, P, and Sb.

The bit line BL extends in the x direction, and is electrically connected to the second end portion 12b of the magnetic member 12. In this embodiment, the bit line BL is disposed immediately above the later-mentioned fourth portions $40d_1$ and $40d_2$ of the yoke 40 so as to be in contact with the fourth portions $40d_1$ and $40d_2$. Alternatively, the bit line BL is disposed above the fourth portions 40d, and $40d_2$ of the yoke 40, and may not be in contact with the fourth portions $40d_1$ and $40d_2$. In that case, the bit line BL is also electrically connected to the second end portion 12b of the magnetic member 12.

The field lines $FL_1$ and $FL_2$ are disposed below the bit line BL, or below the fourth portions $40d_1$ and $40d_2$. The field lines $FL_1$ and $FL_2$ extend in the y direction. Note that the field lines $FL_1$ and $FL_2$ may be combined into one field line.

The yoke 40 is formed with a magnetic material (a soft magnetic material, for example), and is provided so as to surround part of each of the field lines $FL_1$ and $FL_2$. The yoke 40 includes first portions $40a_1$ and $40a_2$, a second portion 40b, third portions $40c_1$ and $40c_2$, fourth portions $40d_1$ and $40d_2$, and a fifth portion 40e. The first portion $40a_1$ and the first portion $40a_2$ are disposed in the vicinity of the second end portion 12b, with the magnetic member 12 interposed in between. Each of the first portions $40a_1$ and $40a_2$ extends in the x direction, and further, is disposed on the lower surface side of the bit line BL. That is, the first portion $40a_1$ and the first portion $40a_2$ are disposed so that one end of one first portion face one end of the other, with the second end portion 12b of the magnetic member 12 being interposed in between.

The second portion 40b is disposed on the tube of the magnetic member 12 near the second end portion 12b, and is connected to the fifth portion 40e. The fifth portion 40e is disposed between the first portion $40a_1$ and the first portion $40a_2$ and in the tube of the second end portion 12b of the magnetic member 12.

The third portion $40c_1$ extends in the z direction, and one end thereof is connected to the other end of the first portion $40a_1$. The third portion $40c_2$ extends in the z direction, and one end thereof is connected to the other end of the first portion $40a_2$. The fourth portion 40d, extends in the x direction, and one end thereof is connected to the other end of the third portion $40c_1$. The fourth portion $40d_2$ extends in the x direction, and one end thereof is connected to the other end of the third portion $40c_2$. The second portion 40b extends in the z direction, and is connected to the other end of each of the fourth portions 40d, and $40d_2$.

Some portions of the first portion $40a_1$, the third portion $40c_1$, the fourth portion $40d_1$, the second portion 40b, and the fifth portion 40e surround part of the field line $FL_1$, and some portions of the first portion 40a2, the third portion $40c_2$, the fourth portion $40d_2$, the second portion 40b, and the fifth portion 40e surround part of the field line $FL_2$. That is, some portions of the first portion $40a_1$, the third portion $40c_1$, the fourth portion $40d_1$, the second portion 40b, and the fifth portion 40e constitute a first magnetic circuit. The first magnetic circuit strengthens an induced magnetic field caused by the write current supplied from the control circuit 100 shown in FIG. 1 to the field line $FL_1$, and transmits the strengthened induced magnetic field to the second end portion 12b of the magnetic member 12. Also, some portions of the first portion $40a_2$, the third portion $40c_2$, the fourth portion $40d_2$, the second portion 40b, and the fifth portion 40e constitute a second magnetic circuit. The second magnetic circuit strengthens an induced magnetic field caused by the write current supplied from the control circuit 100 to the field line $FL_2$, and transmits the strengthened induced magnetic field to the second end portion 12b of the magnetic member 12.

(Write Operation)

Next, a write operation to be performed by the magnetic memory of this embodiment is described.

To perform writing on the memory cell 10, write currents of opposite directions are applied to the two field lines $FL_1$ and $FL_2$ with the control circuit 100. For example, in a case where writing is performed on the memory cell 10, write currents of opposite directions are first applied to the field line $FL_1$ and the field line $FL_2$. If a write current is applied to the field line $FL_1$ from the front to the back in FIG. 1, and a write current is applied to the field line $FL_2$ from the back to the front in FIG. 1 at this point of time, a current magnetic field of a clockwise direction is generated around the field line $FL_1$, a current magnetic field of a counterclockwise direction is generated around the field line $FL_2$, and a magnetic field is also induced in the yoke 40 surrounding each of the field lines by these current magnetic fields. With these write currents, information (a magnetization direction) corresponding to the write currents is written into the upper portion (the second end portion 12b) of the magnetic member 12 of the memory cell 10 located below the adjacent field lines, or between the field line $FL_1$ and the field line $FL_2$, for example. The information (the magnetization direction) to be written at this point of time is a magnetization direction that is parallel to the x-y plane and is a direction from the inner circumference toward the outer circumference of the magnetic member 12.

On the other hand, if the directions of the write currents to be applied to the field line $FL_1$ and the field line $FL_2$ are reversed from those described above, the information (the magnetization direction) to be written into the magnetic member 12 of the memory cell 10 is a magnetization direction that is parallel to the x-y plane and is a direction from the outer circumference toward the inner circumference of the magnetic member 12.

As such a write operation is performed, information is written into the upper portion (the second end portion 12b) of the magnetic member 12. A shift current for moving a domain wall in the magnetic member 12 is applied between the bit line BL and the source line SL by the control circuit 100, and the written information is moved downward and is stored into the memory area (a shift operation). Note that the polarity of the shift current is determined depending on the material or the like of the magnetic member 12.

(Read Operation)

Next, a read operation is described. In a case where information is to be read from the memory cell 10, when the information to be read is located at the lowermost portion of the magnetic member 12 of the memory cell 10, or in a region close to the MTJ element 14, the magnetization direction of the free layer 14a of the MTJ element 14 has also changed with the information stored at the lowermost portion of the magnetic member 12. Therefore, a read current is applied between the bit line BL and the source line SL with the control circuit 100, and information from the MTJ element 14 is read. This read information corresponds to the resistance state of the MTJ element 14. A case where the resistance state of the MTJ element 14 is high corresponds to a state in which the magnetization directions of the free layer 14a and the fixed layer 14c of the MTJ element 14 differ from each other (an antiparallel state, for example), and a case where the resistance state of the MTJ element 14 is low corresponds to a state in which the magnetization directions of the free layer 14a and the fixed layer 14c of the MTJ element 14 are the same (a parallel state), for example.

In a case where the information to be read does not exist at the lowermost portion of the magnetic member 12 of the memory cell 10, a shift current is applied between the bit line BL and the source line SL with the control circuit 100, and the information to be read is moved so as to be located at the lowermost portion of the magnetic member 12. After that, the read operation described above is performed, to read the information.

Figure 4A:
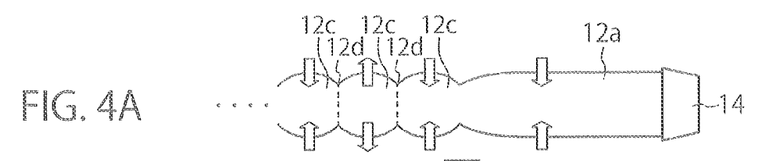
FIGS. 4A to 4D are diagrams for explaining a shift operation of a magnetic memory of the first embodiment.
Figure 4B:
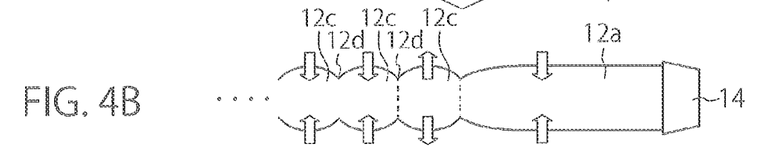
Figure 4C:
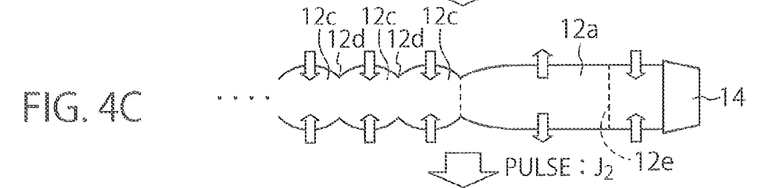
Figure 4D:
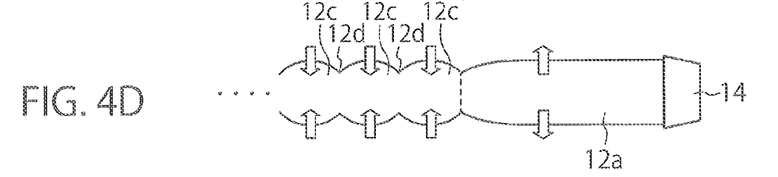

In this embodiment, the length of the first end portion 12a in the z direction is greater than half the length of the regions 12c in the z direction. Therefore, in a case where a shift current J1 is applied to the magnetic member 12 to shift each domain wall toward the first end portion 12a as shown in FIGS. 4A, 4B, and 4C, there is a possibility that a domain wall 12e will stop in the first end portion 12a. Therefore, in this embodiment, a current J2 that is smaller than the shift current J1 is applied between the bit line BL and the source line SL as shown in FIG. 4D, so that the domain wall 12e can reach the lowermost portion of the magnetic member 12. At this point of time, the domain walls other than that in the first end portion 12a are in a stopped state.

As described above, according to this embodiment, the magnetic member 12 is designed so that the length of the first end portion 12a of the magnetic member 12 in the z direction is greater than half the length of the regions 12c in the z direction, and the curvature of the first end portion 12a is smaller than the curvature of the region 12c in a case where the magnetic member 12 is cut along a plane that is parallel to the z direction and includes the central axis of the magnetic member 12. Accordingly, it is possible to prevent an increase in the threshold of the shift current and prevent the occurrence of a shift error. Thus, the stop position of each domain wall can be accurately controlled.

Further, in this embodiment, like the length of the first end portion 12a, the length of the second end portion 12b in the z direction is greater than half the length of the region 12c in the z direction. Accordingly, it is also possible to prevent an increase in the threshold of the shift current and accurately control the stop position of each domain wall.

As is well known, the magnetic member 12 according to this embodiment is manufactured by an anodization method, for example. This is conducted in the following manner. First, the source line SL is formed on a silicon substrate, the switching portion 18 is formed on the source line SL, the nonmagnetic conductive layer 16 is formed on the switching portion 18, the magnetoresistive element 14 is formed on the nonmagnetic conductive layer 16, and the nonmagnetic conductive layer 13 is formed on the magnetoresistive element 14 (see FIG. 1). At this point of time, the magnetoresistive element 14, the switching portion 18, and the source line SL are covered with a first insulating film made of silicon oxide, for example. The first insulating film is planarized by chemical mechanical polishing (CMP), so that the upper surface of the nonmagnetic conductive layer 13 is exposed. A metal layer (not shown) made of aluminum, for example, is then formed so as to cover the upper surface of the nonmagnetic conductive layer 13 and the upper surface of the insulating film.

The metal layer is then subjected to anodization. During the anodization, energizing is performed in an electrolyte solution (sulfuric acid, oxalic acid, phosphoric acid, or a mixture these acids, for example), with the metal layer or the substrate being the anode. At this point of time, the metal layer (aluminum) is oxidized to turn into metal ions, and is dissolved. The metal ions are bonded to oxygen in the solution to form a metal oxide (aluminum oxide), and remain on the surface of the metal layer to grow. At this point of time, dissolution and growth proceed simultaneously, so that a minute hole surrounded by the aluminum oxide is formed on the surface of the aluminum of the metal layer. The upper surface of the magnetoresistive element 14 is exposed through the bottom surface of the hole. While the hole is formed, a first voltage is applied so as to form the portion corresponding to the first end portion 12a of the magnetic member 12, a second voltage lower than the first voltage is applied so as to form the portions corresponding to the narrowed portions 12d, and a third voltage equal to or higher than the first voltage is applied so as to form the portions corresponding to the regions 12c. During the application of the second voltage, portions (not shown) having a small dimension (diameter) in the x direction and the y direction shown in FIG. 1 are formed. These small portions correspond to the narrowed portions 12d shown in FIG. 1. The time during which the first voltage is applied is longer than the time during which the third voltage is applied. Accordingly, the length of the portion corresponding to the first end portion 12a in the z direction can be made greater than the length of the portions corresponding to the regions 12c in the z direction. The vicinity of the region in which the hole is formed changes from aluminum to aluminum oxide. A magnetic material film is then formed on the side surface of the hole, and thus, the magnetic member 12 is completed.

(First Modification)

Figure 5:
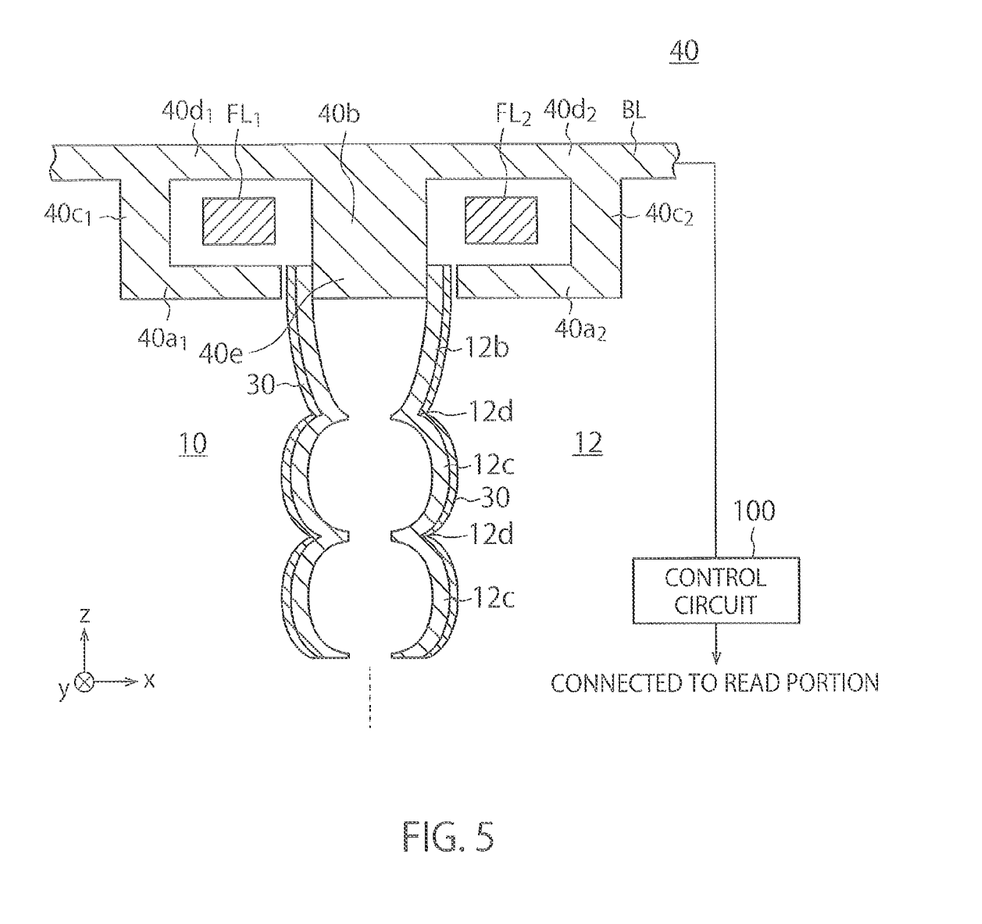
FIG. 5 is a cross-sectional diagram showing the configuration of a magnetic memory according to a first modification of the first embodiment.

Referring now to FIG. 5, a magnetic memory according to a first modification of the first embodiment is described. FIG. 5 is a cross-sectional view of the vicinity of the write unit of the magnetic memory according to the first modification. The magnetic memory of the first modification has a configuration in which a nonmagnetic metal layer 30 is disposed on the outer surface of the magnetic member 12 of the magnetic memory of the first embodiment shown in FIG. 1. This nonmagnetic metal layer 30 is made of a material capable of generating spin orbit torque (SOT) in the magnetic member 12. For the nonmagnetic metal layer 30, hafnium, tantalum, tungsten, rhenium, osmium, iridium, platinum, gold, or the like is used, for example.

In the magnetic memory of the first modification, when a shift current for shifting each domain wall is applied between the source line SL and the bit line BL, the shift current flows in the magnetic member 12 and the nonmagnetic metal layer 30. Accordingly, a shift current caused by spin transfer torque flows in the magnetic member 12. Further, a spin current is generated in the nonmagnetic metal layer 30, the SOT acts on the spin of the magnetic member 12 due to the spin current, and a drive current for shifting each domain wall can be obtained. Accordingly, while being assisted by the spin current generated in the nonmagnetic metal layer 30, a domain wall smoothly passes through the second end portion 12b of the magnetic member 12 without being stopped at the second end portion 12b of the magnetic member 12. Thus, an increase in the shift current can be prevented. Note that the nonmagnetic metal layer 30 does not need to be disposed on the side surface of the magnetic member 12 from the second end portion 12b to the first end portion 12a, but is only required to be disposed at least on the side surface of the second end portion 12b. Although the nonmagnetic metal layer 30 is disposed outside the magnetic member 12 in FIG. 5, the nonmagnetic metal layer 30 may be disposed inside the magnetic member 12.

Further, in the first modification, the diameter of the second end portion 12b connected to the fifth portion 40e of the yoke 40 is larger than the diameter of the second end portion 12b at a location other than the vicinity of the narrowed portion 12d closest to the second end portion 12b. That is, the diameter of the second end portion 12b is larger at a portion closer to the fifth portion 40e.

In general, a domain wall characteristically moves to a portion having a large curvature. However, at a portion where the curvature is not so large, a domain wall moves to a portion where the cross-sectional area of the magnetic member 12 is small. In the first modification, the cross-sectional area of the second end portion 12b becomes gradually larger in the direction from the first end portion 12a toward the second end portion 12b. Accordingly, it is possible to prevent a domain wall from moving outside from the second end portion 12b when the write current is turned off.

Like the magnetic memory of the first embodiment, the magnetic memory of the first modification can also prevent an increase in the threshold of the shift current, and can prevent the occurrence of a shift error. Thus, the stop position of each domain wall can be accurately controlled. Further, the length of the second end portion 12b in the z direction is greater than half the length of the regions 12c in the z direction, as in the first embodiment. Thus, it is also possible to prevent an increase in the threshold of the shift current and accurately control the stop position of each domain wall.

(Second Modification)

Figure 6:
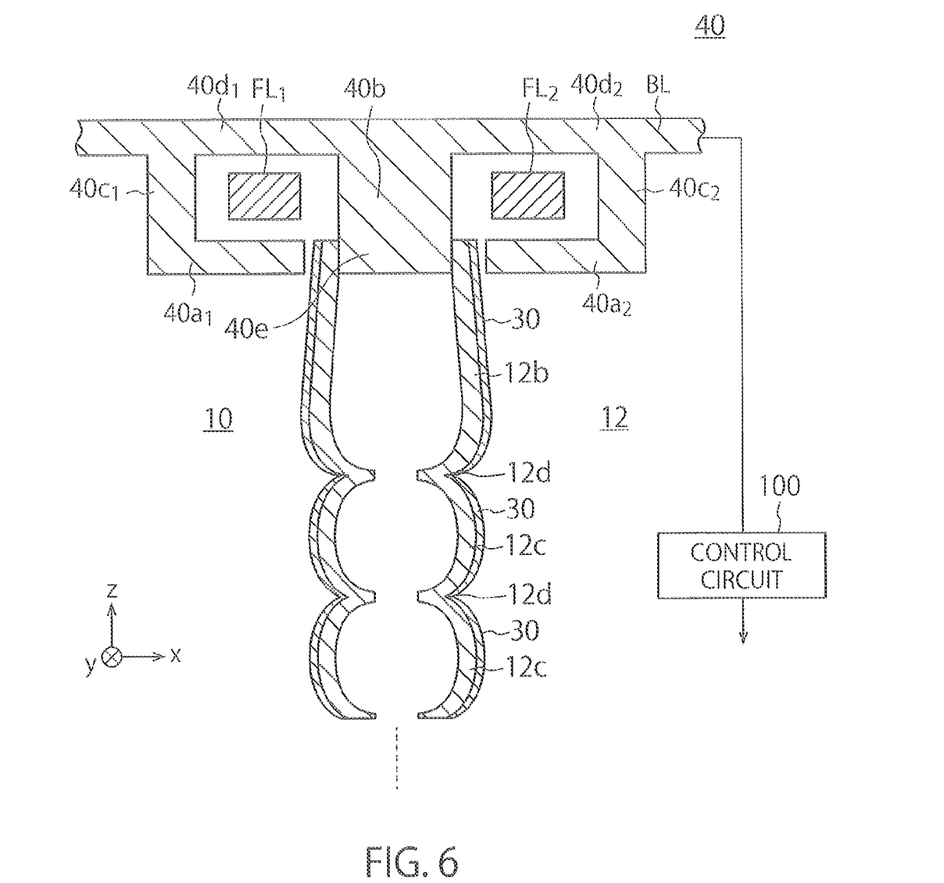
FIG. 6 is a cross-sectional diagram showing the configuration of a magnetic memory according to a second modification of the first embodiment.

Referring now to FIG. 6, a magnetic memory according to a second modification of the first embodiment is described. FIG. 6 is a cross-sectional view of the vicinity of the write unit of the magnetic memory according to the second modification. The magnetic memory of the second modification differs from the magnetic memory of the first modification shown in FIG. 5 in the shape of the second end portion 12b of the magnetic member 12. In the second modification, the diameter of the second end portion 12b connected to the fifth portion 40e of the yoke 40 is smaller than the diameter of the second end portion 12b at a location other than the vicinity of the narrowed portion 12d closest to the second end portion 12b. That is, the diameter of the second end portion 12b becomes gradually smaller in the direction toward the fifth portion 40e. In other words, the curvature of the second end portion 12b on the side of the closest narrowed portion 12d is larger than the curvature of the second end portion 12b on the side of the fifth portion 40e.

In the second modification, a domain wall is less likely to be prevented from moving out from the second end portion 12b when the write current is turned off, compared with the first modification. However, in a case where the change in the cross-sectional area of the second end portion 12b is gradual as in the second modification, the domain wall moves toward the curved portion of the second end portion 12b, and thus, the domain wall can be prevented from moving to the outside.

Like the magnetic memory of the first embodiment, the magnetic memory of the second modification can also prevent an increase in the threshold of the shift current, and can prevent the occurrence of a shift error. Thus, the stop position of each domain wall can be accurately controlled.

Further, the length of the second end portion 12b in the z direction is greater than half the length of the regions 12c in the z direction, as in the first embodiment. Thus, it is also possible to prevent an increase in the threshold of the shift current and accurately control the stop position of each domain wall.

Second Embodiment

Figure 7:
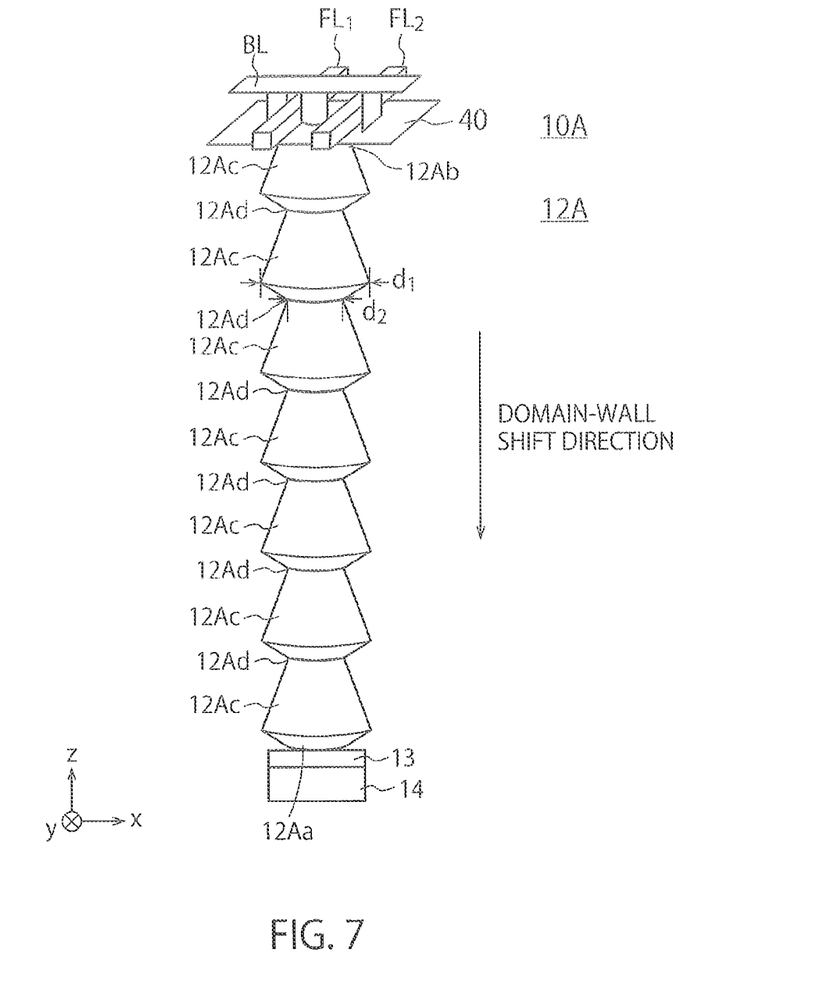
FIG. 7 is a cross-sectional diagram showing the configuration of a magnetic memory according to a second embodiment.
Figure 8A:
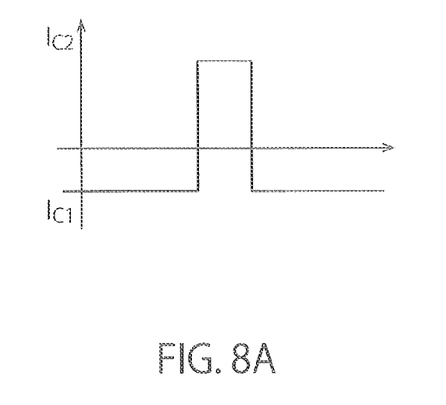
FIGS. 8A to 8D are diagrams for explaining a shift operation of the magnetic memory of the second embodiment.
Figure 8B:
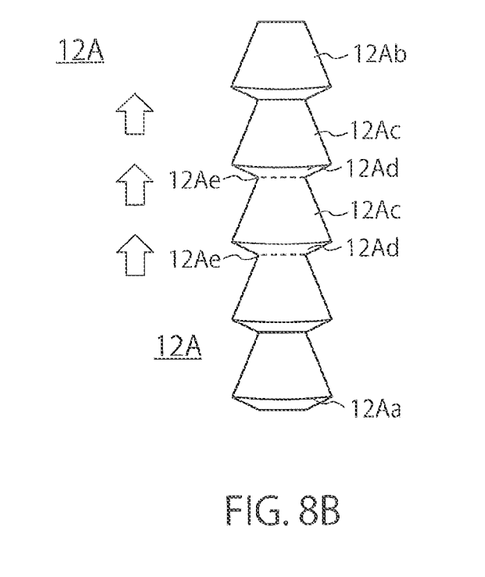
Figure 8C:
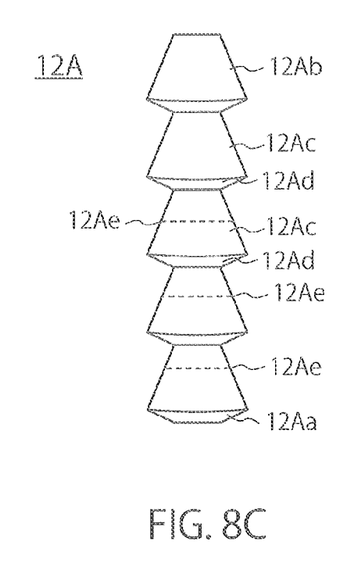
Figure 8D:
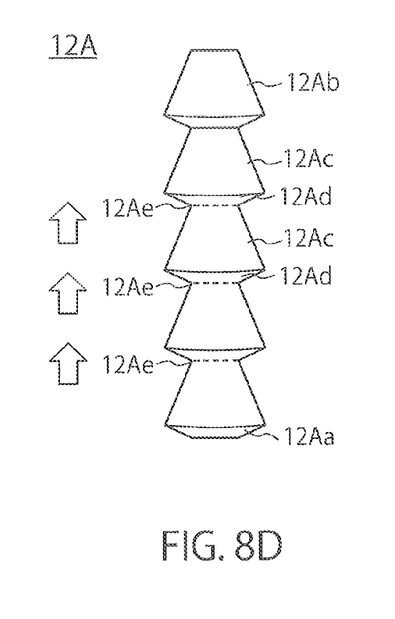
Figure 9:
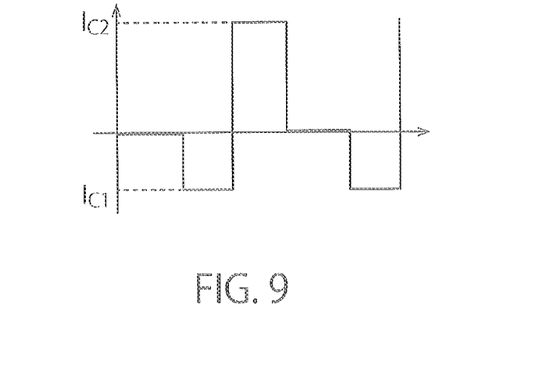
FIG. 9 is a waveform diagram of the current that is used during a shift operation in the magnetic memory of the second embodiment.

Referring now to FIGS. 7 to 9, a magnetic memory according to a second embodiment is described. As shown in FIG. 7, the magnetic memory of the second embodiment has a configuration in which the magnetic member 12 is replaced with a magnetic member 12A in the magnetic memory of the first embodiment shown in FIG. 1.

The magnetic member 12A is formed with a perpendicular magnetic member that incudes a first end portion 12Aa and a second end portion 12Ab, and extends in a first direction (z direction) from the first end portion 12Aa to the second end portion 12Ab. The magnetic member 12A has a tubular shape. For example, the magnetic member 12A can have an outer shape that is a circular shape, an elliptical shape, or a polygonal shape in a cross-section taken along a plane perpendicular to the z direction. Since the magnetic member 12A is formed with a perpendicular magnetic member, the axis of easy magnetization is a direction perpendicular to the z direction. Accordingly, the magnetization direction of the magnetic member 12A is a radial direction, and the magnetic member 12A has an outward magnetization direction or an inward magnetization direction. Like the magnetic member of the first embodiment shown in FIG. 1, the magnetic member 12A has an insulator portion (not shown) provided in its tube.

The magnetic member 12A also includes a plurality of regions 12Ac aligned in the z direction. Narrowed portions 12Ad formed on the outer surface of the magnetic member 12A are located between these regions 12Ac. Further, these regions 12Ac each have at least one magnetic domain. In the magnetic member 12A, when a drive current (a shift current) is supplied between the first end portion 12Aa and the second end portion 12Ab, the domain walls in the magnetic member 12A move in the z direction (the direction indicated by an arrow). In the magnetic member 12A, the first end portion 12Aa is electrically connected to the magnetoresistive element 14, and the second end portion 12Ab is electrically connected to the bit line BL via the yoke 40. Note that, in FIG. 7, the nonmagnetic conductive layer 13 is disposed between the first end portion 12Aa and the magnetoresistive element 14.

Meanwhile, the regions 12Ac in the magnetic member 12A each have a structure in which the area of a cross-section cut along a plane perpendicular to the z-axis becomes gradually smaller in the direction from the first end portion 12Aa toward the second end portion 12Ab. The regions 12Ad each have a structure in which the area of a cross-section cut along a plane perpendicular to the z-axis becomes sharply larger in the direction from the first end portion 12Aa toward the second end portion 12Ab. At each portion at which a region 12Ac and a region 12Ad are joined, the magnetic member 12A has a structure in which the cross-sectional areas of the two regions are substantially equal to each other. That is, in this embodiment, d1>d2 is satisfied, where d1 represents the diameter of the junction between a region 12Ad and the region 12Ac on the side of the second end portion 12Ab, and d2 represents the diameter of the junction (the narrowed portion) between the region 12Ad and the region 12Ac on the side of the first end portion 12Aa. Further, the length of the region 12Ac in the z direction is greater than the length of the region 12Ad in the z direction.

Note that, in a predetermined cross-section of the magnetic member perpendicular to the z direction, the distance between two positions in the outer peripheral portion of the magnetic member may be taken into consideration, as in the first embodiment. In a case where the cross-sectional shape of the magnetic member is a circular shape, for example, this distance corresponds to the diameter of the circle. In a case where the cross-sectional shape of the magnetic member is an elliptical shape, this distance corresponds to the major axis of the ellipse. In a case where the cross-sectional shape of the magnetic member is a polygonal shape, this distance corresponds to the length of one diagonal line of the polygon. The length of the magnetic member in a direction orthogonal to the z direction can be defined on the basis of a cross-section that is parallel to the z direction and includes the above-mentioned two positions between which the distance becomes longest. The diameter d1 and the diameter d2 correspond to the maximum length and the minimum length of the region 12Ac in the direction orthogonal to the z direction, respectively, and also correspond to the maximum length and the minimum length of the region 12Ad, respectively.

As described above, in the magnetic memory of this embodiment, the regions 12Ac each have a structure in which the area of a cross-section cut along a plane perpendicular to the z-axis becomes gradually smaller in the direction from the first end portion 12Aa toward the second end portion 12Ab. Accordingly, the shift current can be made smaller than that in a case where the change in the cross-sectional area of each region 12Ac is sharp. Meanwhile, the regions 12Ad each have a structure in which the area of a cross-section cut along a plane perpendicular to the z-axis becomes sharply larger in the direction from the first end portion 12Aa toward the second end portion 12Ab. Accordingly, each domain wall is more likely to stay at a portion having a small cross-sectional area than in a case where the change in the cross-sectional area of each region 12Ad gradually changes, and thus, the domain walls can be prevented from erroneously shifting.

As the magnetic member 12A has the above-described structure in the magnetic memory of this embodiment, it is possible to prevent an increase in the shift current for moving the domain walls, and control the position of the domain walls in a preferred manner. That is, the stop positions of the domain walls can be accurately controlled.

Next, a domain wall shift operation to be performed in the magnetic memory of this embodiment is described with reference to FIGS. 8A to 8D. First, as shown in FIG. 8A, a shift current Ic1 is applied to the magnetic member 12A. This shift current Ic1 is a current having a negative value, and is a current with which a domain wall 12Ae does not move beyond the slope of a region 12Ad. Here, a positive shift current is a current for moving the domain wall 12Ae in the direction from the second end portion 12Ab toward the first end portion 12Aa. By supplying the negative shift current Ic1 to the magnetic member 12A with the control circuit 100 shown in FIG. 1, it is possible to position the domain walls 12Ae at the portions at which the cross-sectional areas of the regions 12Ad are small, as shown in FIG. 8B. The arrows shown in FIG. 8B indicate the moving direction of the domain walls 12Ae in a case where the shift current Ic1 is supplied to the magnetic member 12A.

A positive shift current Ic2 is then supplied to the magnetic member 12A with the control circuit 100 shown in FIG. 1. The time during which the shift current Ic2 is supplied to the magnetic member 12A is the time during which 1-bit data (information) is shifted. That is, during that time, 1-bit data can be moved from a region 12Ad toward another region 12Ad closest to the region 12Ad in the direction toward the first end portion 12Aa. As the positive shift current Ic2 is supplied to the magnetic member 12A, each domain wall 12Ae moves from a region 12Ad toward another region 12Ad closest to this region 12Ad in the direction toward the first end portion 12Aa. However, the stop positions of the domain walls 12Ae might vary, as shown in FIG. 8C.

Therefore, the negative current Ic1 is supplied to the magnetic member 12A as shown in FIG. 8A, so that the stop positions of the domain walls 12Ae are made uniform. As a result, the domain walls 12Ae stay in the regions 12Ad, as shown in FIG. 8D. The arrows shown in FIG. 8D indicate the moving direction of the domain walls 12Ae in a case where the shift current Ic1 is supplied to the magnetic member 12A. By repeating the operation described above, it is possible to shift data in the direction toward the first end portion 12Aa. Although the absolute value of the current Ic1 is preferably smaller than the absolute value of the current Ic2, the two currents do not necessarily have such a relationship, and may be the same, for example.

In this embodiment, a shift operation is performed with the shift current having the waveform shown in FIG. 8A. However, a shift operation may be performed with a shift current having the waveform shown in FIG. 9. With the shift current having the waveform shown in FIG. 9, no current is supplied to the magnetic member 12A with the control circuit 100 shown in FIG. 1 before a shift operation is performed. When a shift operation is started, the negative shift current Ic1 is supplied from the control circuit 100 to the magnetic member 12A to align the positions of the domain walls 12Ae. The positive shift current Ic2 is then supplied to the magnetic member 12A, to move the domain walls. After that, the current being supplied to the magnetic member 12A is set to zero.

As described above, according to the second embodiment, the stop positions of domain walls can be accurately controlled.

Third Embodiment

Figure 10:
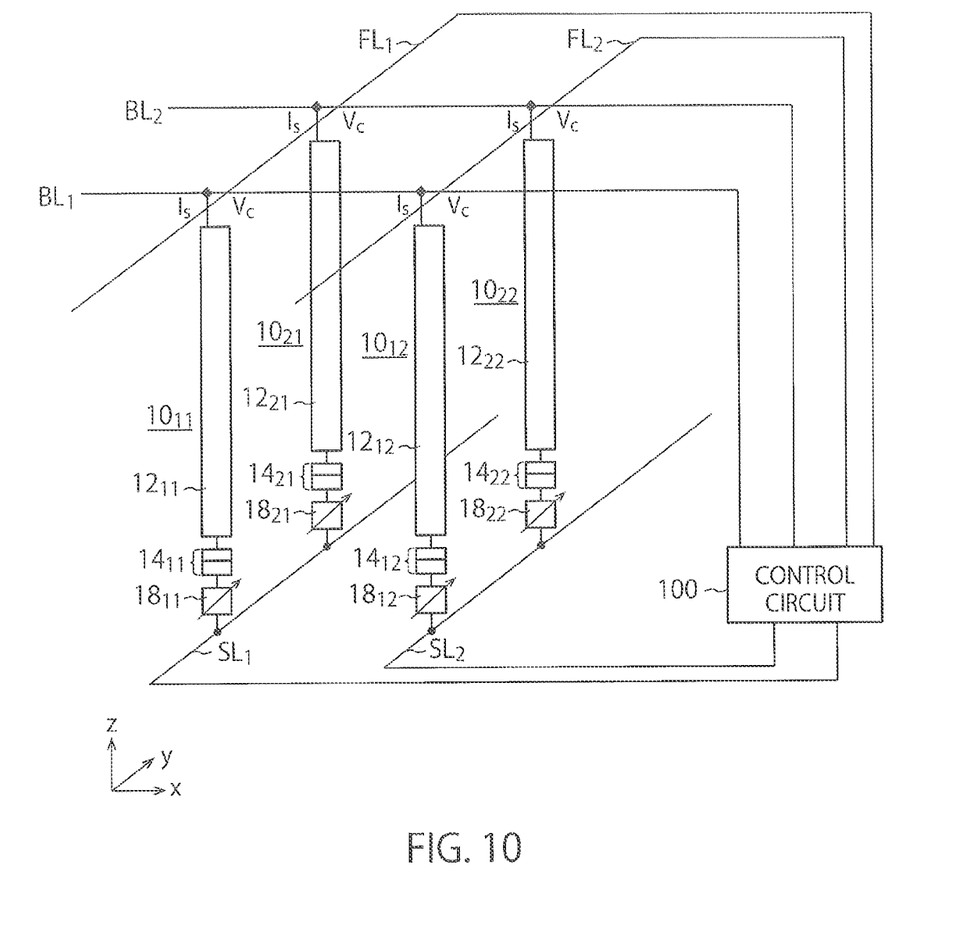
FIG. 10 is a perspective diagram showing the configuration of a magnetic memory according to a third embodiment.

Referring now to FIG. 10, a magnetic memory according to a third embodiment is described. FIG. 10 is a perspective diagram showing the magnetic memory according to the third embodiment. The magnetic memory of the third embodiment includes memory cells $10_{1j}$ to $10_{44}$ arranged in a matrix formed with four rows and four columns. Each memory cell $10_{ij}$ (i, j=1, . . . , 4) has the same structure as the memory cell of the first embodiment. That is, each memory cell $10_{ij}$ (i, j=1, . . . , 4) includes a magnetic member $12_{ij}$, a magnetoresistive element $14_{ij}$, and a switching portion $18_{ij}$. Each magnetic member $12_{ij}$ (i, j=1, . . . , 4) has the same structure as the magnetic member 12 of the first embodiment, each magnetoresistive element $14_{ij}$ (i, j=1, . . . , 4) has the same structure as the magnetoresistive element 14 of the first embodiment, and each switching portion $18_{ij}$ (i, j=1, . . . , 4) has the same structure as the switching portion 18 of the first embodiment.

In each magnetic member $12_{ij}$ (i, j=1, . . . , 4), the second end portion 12b shown in FIG. 1 is electrically connected to a bit line $BL_j$, and the first end portion 12a shown in FIG. 1 is electrically connected to a source line $SL_i$ via the magnetoresistive element $14_{ij}$ and the switching portion $18_{ij}$.

The bit lines $BL_j$ (j=1, 2) extend in the x direction, and the source lines $SL_i$ (i=1, 2) extend in the y direction.

Further, the field line $FL_1$ is disposed in the vicinity of the second end portion of each of the magnetic members $12_{11}$ and $12_{21}$ of the memory cells $10_{11}$ and $10_{21}$, and the field line $FL_2$ is disposed in the vicinity of the second end portion of each of the magnetic members $12_{12}$ and $12_{22}$ of the memory cells $10_{12}$ and $10_{22}$. The source lines $SL_i$ (i=1, 2), the bit lines $BL_j$ (j=1, 2), and the field lines $FL_i$ (i=1, 2) are electrically connected to the control circuit 100.

Like the magnetic memory of the first embodiment, the magnetic memory of the third embodiment designed as described above can accurately control the stop position of each domain wall. Although the memory cells are arranged in a matrix formed with four rows and four columns in the third embodiment, the memory cells may be arranged in a matrix formed with m rows and n columns, where m and n are natural numbers. Although memory cells of the first embodiment are used as the memory cells in the third embodiment, memory cells of the first modification or the second modification of the first embodiment, or the second embodiment may be used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first wiring and a second wiring;
an insulator portion;
a magnetic member that includes: a first portion electrically connected to the first wiring; a second portion electrically connected to the second wiring; and a third portion disposed between the first portion and the second portion, the magnetic member extending in a first direction from the first portion toward the second portion and surrounding the insulator portion, and in a cross-section that is parallel to the first direction and includes part of the magnetic member and part of the insulator portion, a curvature of the first portion being smaller than a curvature of the third portion, a length of the first portion in the first direction being greater than half a length of the third portion in the first direction; and
a control circuit that is electrically connected to the first wiring and the second wiring,
wherein $d_{edgea}/l_{edgea} < d_{ina}/l_{ina}$ is satisfied,
where $d_{edgea}$ represents half a difference between a maximum length and a minimum length of the first portion in a second direction orthogonal to the first direction, $d_{ina}$ represents half a difference between a maximum length and a minimum length of the third portion in the second direction, $l_{edgea}$ represents a length of the first portion in the first direction, and $l_{ina}$ represents half a length of the third portion in the first direction.

2. The magnetic memory according to claim 1, wherein $d_{edgeb}/l_{edgeb} < d_{ina}/l_{ina}$ is satisfied,
where a length of the second portion in the first direction is greater than half the length of the third portion in the first direction, $d_{edgeb}$ represents half a difference between a maximum length and a minimum length of the second portion in the second direction, and $l_{edgeb}$ represents the length of the second portion in the first direction.

3. The magnetic memory according to claim 2, wherein the magnetic member further includes a fourth portion disposed between the first portion and the third portion, and a fifth portion disposed between the third portion and the second portion, and a minimum length and a maximum length of each of the fourth portion and the fifth portion in the second direction are substantially equal to the minimum length and the maximum length of the third portion.

4. The magnetic memory according to claim 3, wherein the second portion of the magnetic member includes a sixth portion and a seventh portion disposed at a position farther from the first portion than the sixth portion, and a maximum length of the seventh portion in the second direction is greater than a maximum length of the sixth portion in the second direction.

5. The magnetic memory according to claim 1, wherein a nonmagnetic metal layer is further disposed on at least a face of the second portion on the opposite side from the insulator portion.

6. The magnetic memory according to claim 1, further comprising a magnetoresistive element that is disposed between the first wiring and the first portion.

7. The magnetic memory according to claim 1, further comprising a third wiring that applies a magnetic field to the magnetic member when an electric current is applied to the third wiring,
wherein the control circuit is electrically connected to the third wiring.

8. The magnetic memory according to claim 7, further comprising a magnetic material portion that surrounds the third wiring.

9. The magnetic memory according to claim 1, wherein the control circuit supplies a first electric current to the magnetic member using the first wiring and the second wiring, and subsequently supplies a second electric current that is smaller than the first electric current.

10. The magnetic memory according to claim 1, wherein the first wiring extends in a second direction intersecting the first direction, and the second wiring extends in a third direction intersecting the first and second directions.

11. A magnetic memory comprising:
a first wiring and a second wiring;
an insulator portion;
a magnetic member that includes: a first portion electrically connected to the first wiring; a second portion electrically connected to the second wiring; a third portion disposed between the first portion and the second portion; and a fourth portion that is disposed between the third portion and the second portion and is connected to the third portion, the magnetic member extending in a first direction from the first portion toward the second portion and surrounding the insulator portion, the third portion including a first end portion located on a side of the first portion and a second end portion located on a side of the fourth portion, a first length of the first end portion in a second direction orthogonal to the first direction being greater than a second length of the second end portion in the second direction, the fourth portion including a third end portion located on a side of the third portion and a fourth end portion located on a side of the second portion, a third length of the third end portion in the second direction being smaller than a fourth length of the fourth end portion in the second direction, a length of the third portion in the first direction being greater than a length of the fourth portion in the first direction; and a control circuit that is electrically connected to the first wiring and the second wiring.

12. The magnetic memory according to claim 11, further comprising a magnetoresistive element that is disposed between the first wiring and the first portion.

13. The magnetic memory according to claim 11, further comprising a third wiring that applies a magnetic field to the magnetic member when an electric current is applied to the third wiring, wherein the control circuit is electrically connected to the third wiring.

14. The magnetic memory according to claim 13, further comprising a magnetic material portion that surrounds the third wiring.

15. The magnetic memory according to claim 11, wherein, after supplying a first electric current to the magnetic member using the first wiring and the second wiring, the control circuit supplies a second electric current that has a greater absolute value than the first electric current and is in a direction opposite to the first electric current.

16. The magnetic memory according to claim 11, wherein, after supplying a first electric current to the magnetic member using the first wiring and the second wiring, the control circuit supplies a second electric current that has a greater absolute value than the first electric current and is in a direction opposite to the first electric current, and supplies the first electric current a predetermined time after an end of supply of the second electric current.

17. The magnetic memory according to claim 11, wherein the first wiring extends in a second direction intersecting the first direction, and the second wiring extends in a third direction intersecting the first and second directions.

* * * * *